United States Patent
Cui

(10) Patent No.: US 8,664,747 B2
(45) Date of Patent: Mar. 4, 2014

(54) TRENCHED SUBSTRATE FOR CRYSTAL GROWTH AND WAFER BONDING

(75) Inventor: Jie Cui, Albany, CA (US)

(73) Assignee: Toshiba Techno Center Inc., Tokyo (JP)

( * ) Notice: Subject to any disclaimer, the term of this patent is extended or adjusted under 35 U.S.C. 154(b) by 162 days.

(21) Appl. No.: 12/111,084

(22) Filed: Apr. 28, 2008

(65) Prior Publication Data

US 2009/0267083 A1  Oct. 29, 2009

(51) Int. Cl.
*H01L 29/06* (2006.01)

(52) U.S. Cl.
USPC .................. 257/618; 257/622; 257/E23.194; 257/E33.002

(58) Field of Classification Search
USPC ............. 257/618, 79, 622, E23.194, E33.002
See application file for complete search history.

(56) References Cited

U.S. PATENT DOCUMENTS

| | | |
|---|---|---|
| 5,306,662 A | 4/1994 | Nakamura et al. |
| 5,408,120 A | 4/1995 | Manabe et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |
| 6,265,726 B1 | 7/2001 | Manabe et al. |
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |

(Continued)

FOREIGN PATENT DOCUMENTS

| | | |
|---|---|---|
| JP | 2626431 | 5/1994 |
| JP | 2681733 | 5/1994 |

(Continued)

*Primary Examiner* — David S Blum
(74) *Attorney, Agent, or Firm* — Hogan Lovells US LLP

(57) ABSTRACT

A substrate for a light emitting diode (LED) can have one or more trenches formed therein so as to mitigate stress build up within the substrate due to mismatched thermal coefficients of expansion between the substrate and layers of material, e.g., semiconductor material, formed thereon. In this manner, the likelihood of damage to the substrate, such as cracking thereof, is substantially mitigated.

27 Claims, 4 Drawing Sheets

(56) References Cited

U.S. PATENT DOCUMENTS

| | | |
|---|---|---|
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,772,125 B2 * | 8/2010 | Kawashima et al. ......... 438/701 |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 8,021,904 B2 | 9/2011 | Chitnis |
| 8,030,665 B2 | 10/2011 | Nagahama et al. |
| 2003/0089946 A1 * | 5/2003 | Hshieh et al. ................ 257/338 |
| 2005/0145862 A1 * | 7/2005 | Kim et al. ....................... 257/91 |
| 2007/0173036 A1 * | 7/2007 | Kusunoki ...................... 438/465 |
| 2008/0142846 A1 * | 6/2008 | Kim et al. ..................... 257/200 |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2956489 | 3/1996 |
| JP | 2666237 | 4/1996 |
| JP | 2735057 | 9/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 3/2012 |

* cited by examiner

US 8,664,747 B2

TRENCHED SUBSTRATE FOR CRYSTAL GROWTH AND WAFER BONDING

TECHNICAL FIELD

The present invention relates generally to the fabrication of devices such as light emitting diodes (LEDs). The present invention relates more particularly to the use of a substrate having trenches or the like formed therein so as to mitigate stress in the substrate during the fabrication of LEDs and other devices.

BACKGROUND

The use of substrates, such as those comprised of sapphire, Si, SiC, and ZnO in the fabrication of light emitting diodes (LEDs) is well known. Substrates are generally provided in the form of wafers. A single wafer can define substrates for many, e.g., hundreds or thousands, of LEDs. Layer of materials, such as semiconductors, conductors, and non-conductors, are formed upon such wafers to define the LEDs.

A problem encountered in the contemporary fabrication of LEDs is the undesirable build up of stress in the wafers or substrates, as well as in materials formed upon the wafer or substrate. Such stress can result in deformation, cracking, bending and/or bowing of the wafer or substrate. A deformed, cracked, bent and/or bowed wafer or substrate can result in the rejection of an entire wafer. There is presently a trend toward the use of larger wafers. Such stress related problems occur more frequently as the size of wafers increases and/or the coefficient of thermal expansion mismatch increases.

For example, stress can build up when a substrate having a layer of another material formed thereon is heated or cooled. The substrate and the layer can have substantially different thermal coefficients of expansion. This results in different rates of contraction and expansion between the substrate and the layer, thus causing stress.

BRIEF SUMMARY

Systems and methods are disclosed herein to provide substrates for use in such applications as light emitting diode (LED) fabrication. The substrates can be substantially less susceptible to damage during the fabrication process. For example, in accordance with an example of an embodiment a substrate can be provided that is less likely to deform and/or crack during processing due to a mismatch in the thermal coefficient of expansion between the substrate and material formed thereon.

More particularly, in accordance with an example of an embodiment a substrate for an LED can comprise at least one trench formed therein so as to mitigate stress build up within the substrate. Any desired number of such trenches can be formed in any desired pattern and/or configuration.

In accordance with an example of an embodiment, a method for making LEDs can comprise forming at least one trench in a substrate so as to mitigate stress build up within the substrate. Any desired number of such trenches can be formed in any desired pattern and/or configuration.

Benefits include a substantial reduction in the likelihood of undesirable damage to a wafer during the LED fabrication process. As those skilled in the art will appreciate, such damage can result in the rejection of the entire wafer. A single wafer can contain hundreds or thousands of LEDs. The rejection of a wafer can be undesirably costly. Thus, one or more embodiments can enhance the yield of the LED manufacturing process.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
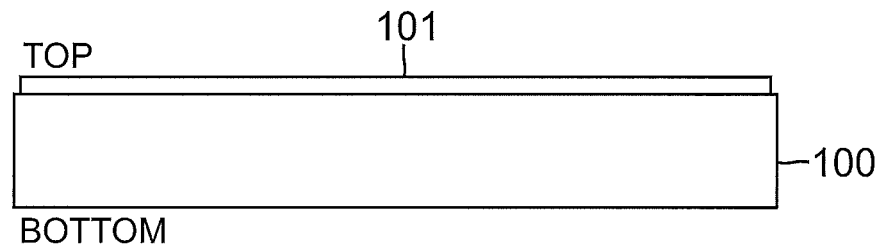
FIG. 1 is a semi-schematic, cross-sectional, side view of a contemporary substrate, e.g., a wafer, having a layer of material, e.g., semiconductor, conductor, and/or non-conductor, formed thereon according to contemporary practice.

Systems and methods are disclosed herein to provide substrates, such as sapphire wafers, for use in light emitting diode (LED) fabrication and the like. The wafers can be substantially less susceptible to damage during the fabrication process. For example, the wafers can be substantially less susceptible to damage caused by temperature change during such as the chemical vapor deposition (CVD) and wafer bonding process.

As discussed above, changes in temperature such as those that occur during the chemical vapor deposition process can cause a wafer to deform, crack, or even break apart. When this occurs, the wafer must generally be discarded. Further, it may be necessary to clean debris from the chemical vapor deposition chamber after such an incident.

According to an example of an embodiment, a substrate for an LED can comprise one or more trenches formed therein so as to mitigate stress build up within the substrate. Any desired number of trenches and configuration of trenches can be used.

The trenches can be generally linear. That is, the trenches can be defined by one or more lines. The lines can intersect one another. For example, the lines can form a cross-hatched, crisscross, or checker-board like pattern. The lines can be oriented randomly.

The trenches can be curved. For example, the trenches can define a non-overlapping concentric circle or bull's eye like pattern. Alternatively, the trenches can define a pattern of overlapping curved lines.

The trenches can define a regular pattern. Alternatively, the trenches can define an irregular pattern. Any desired pattern of straight, curved, regular, and irregular trenches can be used. For example, the trenches can define one or more squares, rectangles, circles, ovals, or other geometric patterns.

The trenches can be formed upon one surface of the wafer. The trenches can be formed upon either the top (the surface upon which materials are deposited during the LED fabrication process) or the bottom surface of the wafer. The trenches can be formed upon both the top and bottom surfaces of the wafer.

When formed upon both surfaces of a wafer, the trenches can be offset with respect to one another. Alternatively, the trenches on the top and bottom surfaces of a wafer can be co-incident with one another. Any desired combination of offset and co-incident trenches can be used.

The trenches can have a depth that is between approximately ⅙ and approximately ½ of the thickness of the substrate. For example, the trenches can have a depth that is approximately ⅓ of the thickness of the substrate deep. The trenches can have any desired depth.

The trenches can be generally rectangular in cross-section. The trenches can be generally u-shaped in cross-section. The trenches can be generally v-shaped in cross-section. The trenches can have any desire cross-sectional shape.

The trenches can extend along at least one or more crystal lattice directions. The trenches can be generally perpendicular to a crystal lattice direction. The trenches can form any desired angle with respect to a crystal lattice direction.

One or more trenches can be formed in a material that is formed upon the wafer. Such trenches can be formed in the manner discussed herein with respect to trenches formed in the wafer. Trenches can be formed in both the wafer and a material formed thereon.

The trenches in the wafer or the material formed thereon can be formed by laser ablation, electron beam etching, chemical etching, die sawing, or any combination thereof. The trenches in the material formed upon the wafer can be formed by patterning. The trenches can be formed by any desired method.

Referring now to FIG. 1, a contemporary wafer 100 has a layer of material 101 formed on it. The wafer 100 can be formed of sapphire, for example. The layer of material 101 can be semiconductor, conductor, non-conductor, or a combination thereof. The layer of material 101 can generally define one or more LEDs or portions thereof. The wafer 100 can have a diameter of approximately ¼ inch to approximately twelve inches. For example, the wafer 100 can have a diameter of approximately two inches. The wafer 100 can have a thickness of approximately 100 microns to approximately four millimeters. For example, the wafer 100 can have a thickness of approximately 400 microns.

Figure 2:
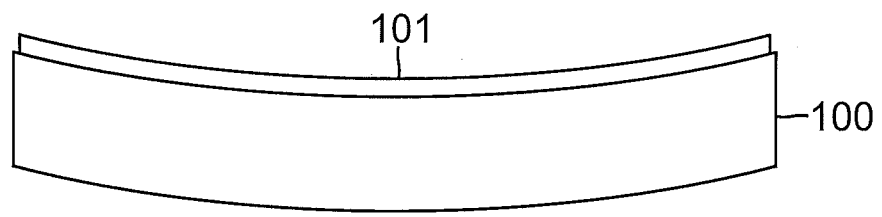
FIG. 2 is a semi-schematic, cross-sectional, side view of the contemporary substrate of FIG. 1, showing the center of the substrate bowed downwardly due to undesirable stress build-up therein during a temperature change and/or during the formation of one or more layers of material on the substrate.

Referring now to FIG. 2, the contemporary wafer 100 and layer of material 101 can deform when a temperature change occurs. For example, the center of the wafer 100 and layer of material 101 can bow downwardly when heated or cooled. Such bowing downwardly can occur when the wafer 100 and the layer of material 101 are heated and the wafer 100 has a higher coefficient of expansion with respect to that of the layer of material 101.

Figure 3:
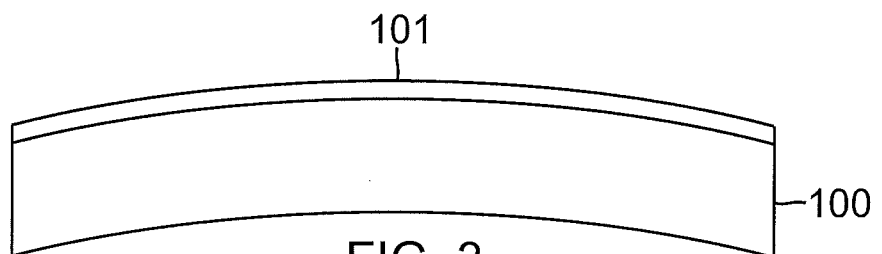
FIG. 3 is a semi-schematic, cross-sectional, side view of the contemporary substrate of FIG. 1, showing the center of the substrate bowed upwardly due to undesirable stress build-up therein during a temperature change and/or during the formation of one or more layers of material on the substrate.

Referring now to FIG. 3, the wafer 100 and layer of material 101 can deform such that the center of the wafer 100 and layer of material 101 can bow upwardly when heated or cooled. Such bowing upwardly can occur when the wafer 100 and the layer of material 101 are cooled and the wafer 100 has a higher coefficient of expansion with respect to that of the layer of material 101.

Thus, the wafer 100 can contract or expand more than the layer of material 101 when the wafer 100 and layer of material 101 are cooled or heated. Similarly, the layer of material 101 can contract or expand more than the wafer 100 when the wafer 100 and layer of material 101 are cooled or heated.

Regardless of how the wafer 100 and layer of material 101 deform in response to cooling or heating thereof, such deformation can result in the generation of undesirable stresses in the substrate and layer of material 101. As those skilled in the art will appreciate, such stresses can result in the formation and propagation of defects, e.g., cracks, in the wafer 100 and/or layer of material 101.

As discussed above, such defects can result in the rejection of LEDs fabricated upon the wafer 100 and can even result in the rejection of the entire wafer 100. In some instances, debris can be formed when a substrate cracks and this debris can damage nearby wafers in a process chamber and can even necessitate premature maintenance, e.g., cleaning, of the chamber, plumbing, and/or vacuum pumps.

Figure 4:
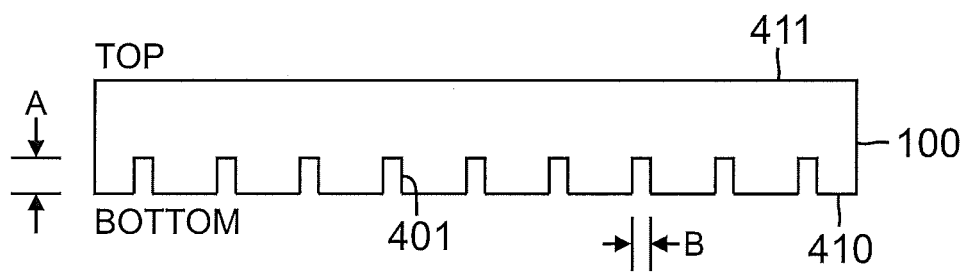
FIG. 4 is a semi-schematic, cross-sectional, side view of a substrate, e.g., a wafer, having a plurality of trenches formed in a bottom surface thereof according to an example of an embodiment.

Referring now to FIG. 4, one or more trenches 401 can be formed in either the wafer 100 or the layer of material 101 (FIGS. 1-3) so as to inhibit the formation of stress therein during temperature changes. As shown in FIG. 4, a plurality of trenches 401 can be formed in the bottom surface 410 of the substrate, for example. Alternatively, such trenches can be formed in the top surface 411 (see FIG. 5) of the wafer 100.

When the wafer 100 and the layer of material 101 deform (such as is shown in FIGS. 2 and 3), such trenches 401 inhibit the undesirable build up of stress. Thus, such trenches 401 substantially reduce the likelihood of damaging a wafer during processing thereof when fabricating LEDs.

Any desired depth, Dimension A, of the trenches 401 can be used. The depth of the trenches 401 can be between approximately 1/10 and approximately 9/10 of the thickness of the wafer 100. For example, the depth of the trenches 401 can be approximately ⅕ of the thickness of the wafer 100.

More particularly, the depth of the trenches 401 can be between approximately ⅙ and approximately ½ of the thickness of the wafer 100. As a further example, the depth of the trenches 401 can be approximately ⅓ of the thickness of the wafer 100.

Any desired width, Dimension B, of the trenches 401 can be used. The trenches 401 can have a width, Dimension B, of between approximately 1 micron and approximately 100 microns. For example, the trenches 401 can have a width, Dimension B, of approximately 20 microns.

Indeed, different trenches can have different depths, widths, and/or distances from one another on a given wafer 100.

Figure 5:
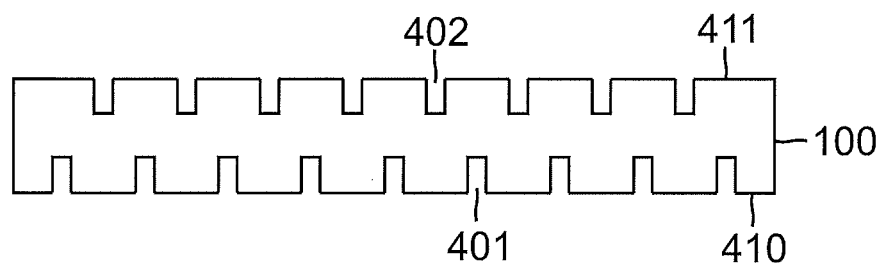
FIG. 5 is a semi-schematic, cross-sectional, side view of a substrate, e.g., a wafer, having a plurality of trenches formed in both a top and a bottom surface thereof according to an example of an embodiment.

Referring now to FIG. 5, trenches 401 and 402 can be formed both in the bottom surface 410 and the top surface 411 of the wafer 100. As shown in FIG. 5, the trenches 401 on the bottom surface 410 are offset with respect to the trenches 402 on the top surface 411 of the wafer 100. Alternatively, the trenches 401 on the bottom surface 410 can be co-incident with respect to the trenches 402 on the top surface 411 of the wafer 100.

Trenches 401 on the bottom surface 410 of the wafer 100 can form the same pattern as trenches 402 on the top surface 411 of the wafer 100. Alternatively, trenches 401 on the bottom surface 410 of the wafer 100 can form a different pattern wither respect to trenches 402 on the top surface 411 of the wafer 100.

Figure 6:
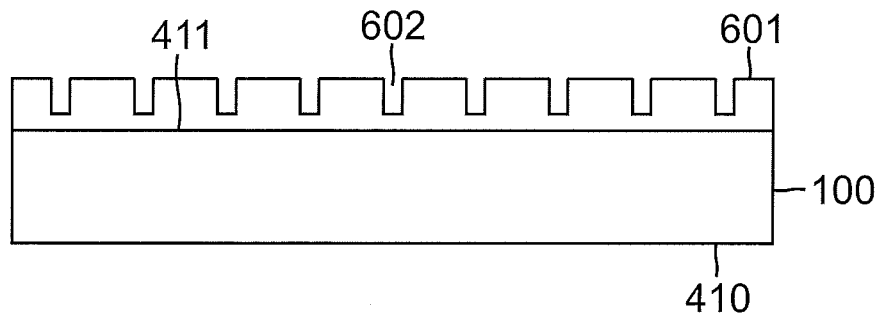
FIG. 6 is a semi-schematic, cross-sectional, side view of a substrate, having a layer of material, e.g., semiconductor, conductor, and/or non-conductor, formed thereon and having a plurality of trenches formed in the layer of material according to an example of an embodiment.

Referring now to FIG. 6, trenches 602 can be formed in a layer of material 601 formed upon the wafer 100. The layer of material 601 can have a thickness of between approximately 0.1 micron and approximately four inches. For example, the layer of material 601 can have a thickness of approximately 10 microns.

Such trenches 602 formed in the layer of material 601 can be either in place of or in addition to trenches 401 formed in the bottom surface 410 of the wafer 100 and/or trenches 402 formed in the top surface 411 of the wafer 100. The dimensions/ratios associated with trenches formed in the layer of material 601 can be similar to those of trenches formed in the wafer 100 or can be different therefrom.

Figure 7:
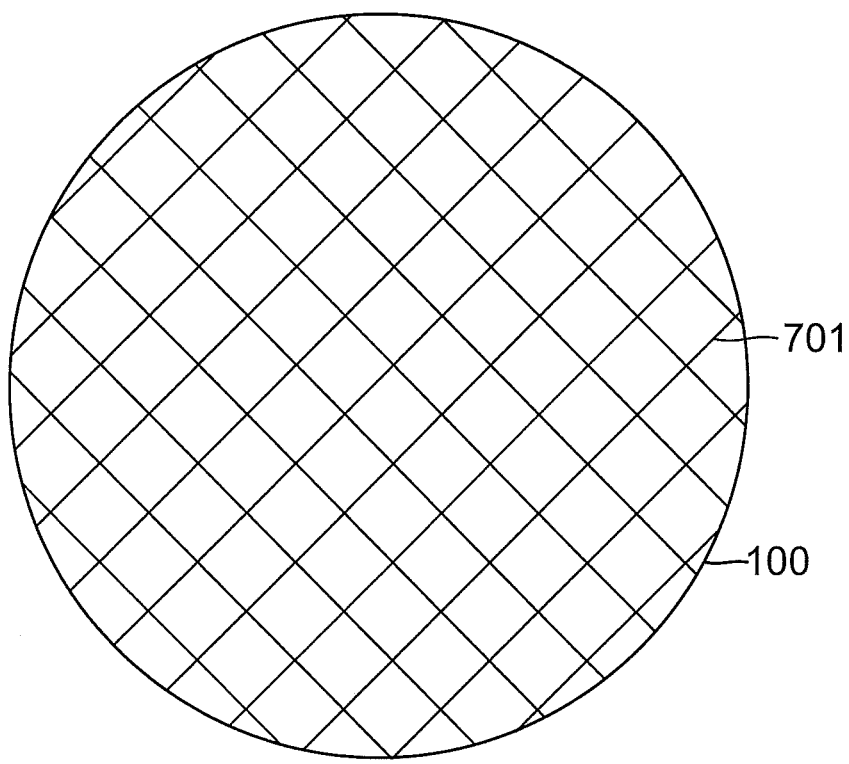
FIG. 7 is a semi-schematic top or bottom view of a substrate (which can be any desired shape, size, or thickness) or a layer of material, e.g., semiconductor, conductor, and/or non-conductor, showing a cross-hatched pattern of trenches formed therein according to an example of an embodiment.

Referring now to FIG. 7, the trenches can be formed in any desired pattern. For example, trenches are formed in a pattern of crossing lines 701. One or more of the lines can be defined with respect to crystal lattice orientation lines of the wafer 100. For example, the lines can be formed along crystal lattice orientation lines of the wafer 100, if desired. Any desired spacing between adjacent lines 701 can be used. Any desired angle between intersecting lines 701 can be used.

The distance between adjacent lines 701 (and thus between adjacent trenches) can be between approximately 100 microns and approximately two millimeters. For example, the distance between adjacent lines 701 can be approximately 200 microns.

Figure 8:
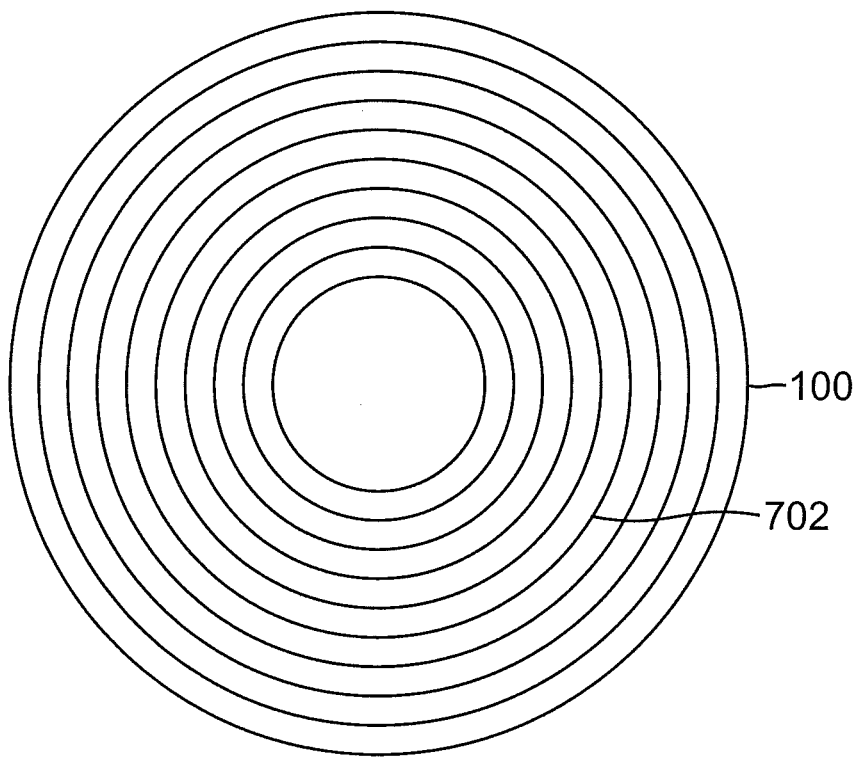
FIG. 8 is a semi-schematic top or bottom view of a substrate or a layer of material, e.g., semiconductor, conductor, and/or non-conductor, showing a concentric circle pattern of trenches formed therein according to an example of an embodiment.

Referring now to FIG. 8, the trenches can be formed in a series of concentric circles 702. Any desired number of circles 702 can be used. Any desired spacing between adjacent circles 702 can be used.

The distance between adjacent circles 702 (and thus between adjacent trenches) can be between approximately 100 microns and approximately two millimeters. For example, the distance between adjacent circles 702 can be approximately 200 microns.

Figure 9:
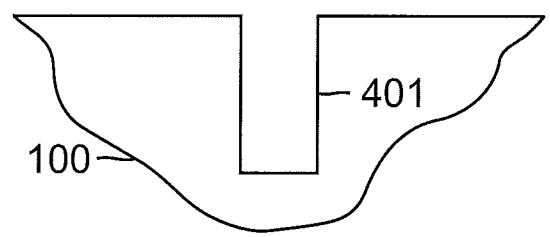
FIG. 9 is a semi-schematic, cross-sectional, side view of a trench having a generally rectangular cross-sectional configuration according to an example of an embodiment.
Figure 10:
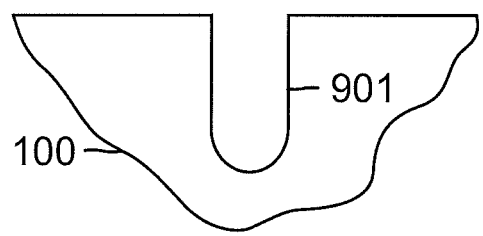
FIG. 10 is a semi-schematic, cross-sectional, side view of a trench having a generally u-shaped cross-sectional configuration according to an example of an embodiment.
Figure 11:
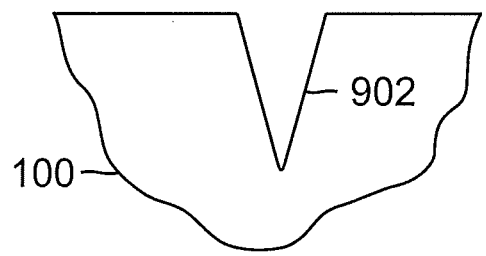
FIG. 11 is a semi-schematic, cross-sectional, side view of a trench having a generally v-shaped cross-sectional configuration according to an example of an embodiment.

Referring now to FIGS. 9-11, the trenches can have any desired cross-sectional configuration. For example, the trenches can have a generally rectangular (FIG. 9) configuration, a generally u-shaped (FIG. 10) configuration, or a generally v-shaped (FIG. 11) configuration. At least some of the trenches can have a length approximately equal to a diameter of the wafer 100, as shown in FIG. 7. At least some of the trenches can have a length approximately equal to a circumference of the wafer 100, as shown in FIG. 8.

Although the term "wafer" is used herein, those skilled in the art will appreciate that aspects of embodiments are applicable to various different substrates. For example, aspects of embodiments can be applied to the substrates of individual dice or LEDs. As such, use of the term "wafer" is by way of example only, and not by way of limitation.

Further, such substrates or wafers can be formed from any desired material. For example, such substrate or wafers can be formed from sapphire, Spinel, ceramic, glass, silicon, SiC, ZnO, or any combination thereof, for example. Indeed, the substrate can be formed of any desired material.

Since the substrates can be substantially less susceptible to damage, such as deformation and/or cracking, yield can be enhanced. Further, expensive down time cause by the need to clean a chemical vapor deposition chamber or the like after a wafer breaks apart therein can be avoided.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A device comprising:
   a wafer having an upper surface and a bottom surface:
   a layer of material formed on the upper surface of the wafer;
   at least one trench formed on an upper surface of the layer; and
   an LED including a plurality of semiconductor layers, which are formed on the upper surface of the layer and the trench(es),
   wherein the trench(es) are configured to mitigate stress caused by a difference between a thermal coefficient of expansion of the wafer and a thermal coefficient of expansion of the plurality of semiconductor layers.

2. The device as recited in claim 1, wherein the wafer comprises sapphire.

3. The device as recited in claim 1, wherein the trench(es) are generally linear.

4. The device as recited in claim 1, wherein the trench(es) define a cross-hatched pattern.

5. The device as recited in claim 1, wherein the trench(es) define a regular pattern.

6. The device as recited in claim 1, wherein a depth of the trench(es) is approximately ⅓ of a thickness of the layer.

7. The device as recited in claim 1, wherein the trench(es) are generally rectangular in cross-section.

8. The device as recited in claim 1, wherein the trench(es) are generally u-shaped in cross-section.

9. The device as recited in claim 1, wherein the trench(es) are generally v-shaped in cross-section.

10. The device as recited in claim 1, wherein the trench(es) extend along at least one crystal lattice direction.

11. The device as recited in claim 1, wherein the trench(es) extend along a plurality of crystal lattice directions.

12. The device as recited in claim 1, wherein:
    a diameter of the wafer is between approximately ¼ inch and approximately twelve inches;
    a thickness of the wafer is between approximately 100 microns and four millimeters;
    a width of the trench(es) is between approximately one micron and approximately 100 microns; and
    a distance between the trenches is between approximately 100 microns and approximately 2 millimeters.

13. The device as recited in claim 1, wherein:
    a diameter of the wafer is approximately two inches;
    a thickness of the wafer is approximately 400 microns;
    a width of the trench(es) is approximately 20 microns; and
    a distance between the trenches is approximately 200 microns.

14. The device as recited in claim 1, wherein the trench(es) have a depth between approximately 1/6 and approximately 1/2 of a thickness of the wafer.

15. The device as recited in claim 1, wherein at least some of the trench(es) have a length approximately equal to a diameter of the wafer.

16. The device as recited in claim 1, wherein at least some of the trench(es) have a length approximately equal to a circumference of the wafer.

17. The device as recited in claim 1, further comprising at least one trench formed on the bottom surface of the wafer, wherein the trench(es) formed on the bottom surface of the wafer are configured to mitigate stress within the wafer caused by the difference between the thermal coefficient of expansion of the wafer and the thermal coefficient of expansion of the plurality of semiconductor layers.

18. The device as recited in claim 1, wherein the trench(es) define a concentric circle pattern.

19. The device as recited in claim 1, wherein at least some of the trench(es) formed on the bottom surface of the wafer have a length approximately equal to a diameter of the wafer.

20. The device as recited in claim 1, wherein at least some of the trench(es) formed on the bottom surface of the wafer have a length approximately equal to a circumference of the wafer.

21. The device as recited in claim 1, further comprising at least one trench formed on the upper surface of the wafer, wherein the trench(es) formed on the upper surface of the wafer are configured to mitigate stress within the wafer caused by the difference between the thermal coefficient of expansion of the wafer and the thermal coefficient of expansion of the plurality of semiconductor layers.

22. The device as recited in claim 1, further comprising at least one trench formed on the upper surface of the wafer and at least one trench formed on the bottom surface of the wafer, wherein the trench(es) formed on the upper surface of the wafer and the trench(es) formed on the bottom surface of the wafer are configured to mitigate stress within the wafer caused by the difference between the thermal coefficient of expansion of the wafer and the thermal coefficient of expansion of the plurality of semiconductor layers.

23. A device comprising:
a wafer having an upper surface and a bottom surface;
a layer formed on the upper surface of the wafer and having at least one trench, the trench(es) formed on an upper surface of the layer and having a depth between approximately 1/6 and approximately 1/2 of a thickness of the wafer; and
an LED including a plurality of semiconductor layers, which are formed on the upper surface of the layer and the trench(es),
wherein the trench(es) are configured to mitigate stress caused by a difference between a thermal coefficient of expansion of the wafer and a thermal coefficient of expansion of the plurality of semiconductor layers, and the trench(es) define a concentric circle pattern.

24. The device as recited in claim 23, further comprising at least one trench formed on the bottom surface of the wafer, wherein the trench(es) formed on the bottom surface of the wafer are configured to mitigate stress within the wafer caused by a difference between a thermal coefficient of expansion of the wafer and a thermal coefficient of expansion of the plurality of semiconductor layers.

25. The device as recited in claim 24, wherein the trench(es) formed on the bottom surface of the wafer have a depth between approximately 1/6 and approximately 1/2 of a thickness of the wafer.

26. The device as recited in claim 23, further comprising at least one trench formed on the upper surface of the wafer, wherein the trench(es) formed on the upper surface of the wafer are configured to mitigate stress within the wafer caused by a difference between a thermal coefficient of expansion of the wafer and a thermal coefficient of expansion of the plurality of semiconductor layers.

27. The device as recited in claim 23, further comprising at least one trench formed on the upper surface of the wafer and at least one trench formed on the bottom surface of the wafer, wherein the trench(es) formed on the upper surface of the wafer and the trench(es) formed on the bottom surface of the wafer are configured to mitigate stress within the wafer caused by a difference between a thermal coefficient of expansion of the wafer and a thermal coefficient of expansion of the plurality of semiconductor layers.

* * * * *